(12) United States Patent
Nakashima et al.

(10) Patent No.: US 6,908,509 B2
(45) Date of Patent: Jun. 21, 2005

(54) CZ RAW MATERIAL SUPPLY METHOD

(75) Inventors: Katsunori Nakashima, Tokyo (JP); Makoto Ito, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 122 days.

(21) Appl. No.: 10/647,108

(22) Filed: Aug. 25, 2003

(65) Prior Publication Data
US 2004/0112276 A1 Jun. 17, 2004

(30) Foreign Application Priority Data

Aug. 26, 2002 (JP) ........................................ 2002-245287

(51) Int. Cl.[7] .............................................. C30B 15/02
(52) U.S. Cl. ............................. 117/13; 117/18; 117/33; 117/214; 117/932
(58) Field of Search ............................. 117/13, 18, 33, 117/214, 932

(56) References Cited

U.S. PATENT DOCUMENTS 5,492,079 A * 2/1996 Geissler et al. ............... 117/30
5,690,733 A * 11/1997 Nagai et al. ................... 117/18
5,902,396 A * 5/1999 Purdy ........................... 117/71
6,106,617 A * 8/2000 Yatsurugi .................... 117/214
6,805,746 B2 * 10/2004 Moroishi et al. ........... 117/214

\* cited by examiner

Primary Examiner—Robert Kunemund
(74) Attorney, Agent, or Firm—Morrison & Foerster LLP

(57) ABSTRACT

Additional charge of a solid raw material 13 in the shapes of granules/lumps, low in raw material cost, and with no risk of cracking, is performed into a molten raw material 14 in a crucible in a static manner without solidifying a surface of the molten raw material 14 in the crucible 3. A bottom of a cylindrical raw material vessel 10 made of a material non-meltable when being in contact with the molten raw material 14 in the crucible 3 is closed with a bottom cover 11 made of a material meltable and removable when being in contact with the molten raw material 14 in the crucible 3. The raw material vessel 10 in a state of being filled with the solid raw material 13 in the shapes of granules/lumps is hung down above the crucible 3 to immerse the lower portion thereof into the molten raw material 14 in the crucible 3. The bottom cover 11 is molten and removed by putting the bottom cover 11 into contact with the molten raw material 14 in the crucible 3 to thereby charge the solid raw material 13 in the raw material vessel 10 into the molten raw material 14 in the crucible 3.

7 Claims, 4 Drawing Sheets

CZ RAW MATERIAL SUPPLY METHOD

BACKGROUND OF THE INVENTION

1. Field of the Invention

The present invention relates to a CZ raw material supply method used for forming a molten raw material in single crystal growth by means of a CZ method, and more particularly, to a CZ raw material supply method used in charging a solid raw material in recharge and additional charge.

2. Description of the Background Art

In silicon single crystal growth by means of a CZ method, as well known, poly-silicon in a solid state initially charged in a crucible is heated with a heater to melt. After a raw material melt is formed in the crucible in such a way, a seed is dipped into the molten raw material in the crucible and, starting in this state, the seed is raised while rotating the seed and the crucible, thereby growing a silicon single crystal in the shape of a cylinder at and below the lower end of the seed. As a solid raw material initially charged in the crucible, there are used cut rods, lumps, granules and others, either alone or in combination.

In such a silicon single crystal growth, a solid raw material initially charged in a crucible is molten to decrease its volume; therefore an amount of the molten raw material is limited to be smaller as compared with a volume of the crucible, leading to an unavoidable reduction in productivity. In order to avoid such an inconvenience, it has been contrived in ways to increase a charge amount of a raw material into a crucible, as one of which a technique called additional charge has been developed.

In the additional charge, a solid raw material initially charged in a crucible is molten and thereafter, a solid raw material is additionally charged into the molten raw material in the crucible. As one of modes for raw material charge, there is exemplified a method in which a solid raw material in the shapes of granules/lumps is additionally charged into a molten raw material in a crucible with a raw material supply tube inserted in a furnace (JP A 97 (H9)-208368, JP A 99(H11)-236290 and others). A solid raw material in the shapes of granules/lumps is additionally charged into a molten raw material in a crucible to thereby increase an amount of the molten raw material in the crucible and in turn, use a volume of the crucible effectively, leading to improvement on productivity.

Furthermore, raw material supply called recharge is performed for the purpose to reduce a crucible cost. This is a technique in which after a single crystal is pulled up, a solid raw material is additionally charged into a remaining melt in the crucible to thereby again form a molten raw material at a prescribed amount in the crucible and to then perform pulling-up of a single crystal, followed by repetition of the operations with the result of an increased number of pulling-up times per one crucible. In this technique, additional charge of a solid raw material is recharge, which is implemented in a similar way to the additional charge described above.

In a prior art raw material supply method in which a solid raw material in the shapes of granules/lumps is additionally charged into a molten raw material in a crucible with a raw material supply tube, however, a problem arises that splashing of the molten raw material occur in company with dropping of a solid raw material and flying droplets of the molten raw material are attached onto parts in a furnace to shorten lifetimes thereof, or exert an adverse influence on single crystal growth.

In order to solve a problem of the melt splashing, a method is contrived in which a surface of a molten raw material in a crucible is solidified and thereafter, a solid raw material is dropped thereonto, followed by melting the dropped raw material together with a solidified layer of the surface. In this method, no splashing of a molten raw material occurs whereas an extra power is required to melt the solidified layer, resulting in a problem to increase a power cost.

Incidentally, poly-silicon rods are also used as a solid raw material in additional charge or recharge, but in this case, poly-silicon rods are more expensive as compared with poly-silicon in the shapes of granules/lumps and have a risk of falling off of a part thereof due to cracking.

SUMMARY OF THE INVENTION

It is an object of the present invention to provide a CZ raw material supply method capable of additionally charging a solid raw material in the shapes of granules/lumps, low in raw material cost, and with no risk of cracking, into a molten raw material in a static manner without solidifying a surface of the molten raw material in a crucible.

In order to achieve the above object, a CZ raw material supply method of the present invention includes: a step of closing a bottom of a cylindrical raw material vessel made of a material non-meltable when being in contact with a molten raw material in a crucible with a bottom cover made of a material meltable and removable when being in contact with the molten raw material in the crucible to cause the raw material vessel to be filled with a solid raw material in the shapes of granules/lumps; a step of hanging down the raw material vessel, attached with the bottom cover, and filled with the solid raw material above the crucible to melt the bottom cover by putting it into contact with the molten raw material in the crucible and to thereby open a bottom of the raw material vessel; and a step of supplying the solid raw material in the raw material vessel into the molten raw material in the crucible from the opened bottom.

As a method for melting the bottom cover, generally exemplified is a method in which a lower portion of the raw material vessel is immersed into the molten raw material in the crucible, while no necessity always arises for immersing the lower portion of the raw material vessel into the molten raw material in the crucible, but a method may also be adopted in which the lower portion of the raw material vessel is moved close to the molten raw material in the crucible to thereby immerse the bottom cover protruding downwardly from inside the lower portion thereof. In the latter method, even if only the lower part of the bottom cover is molten, the remaining bottom cover can be dropped and removed from inside the lower portion of the raw material vessel.

According to the present invention, the cylindrical raw material vessel is filled with a solid raw material in the shapes of granules/lumps with the bottom cover closing a bottom of the raw material vessel, hung down above the crucible and moved down so that the lower portion thereof is immersed or located close to a molten raw material in the crucible. By doing so, there occurs melting and removal of the bottom cover made of a meltable material by putting the bottom cover into contact therewith to thereby open the bottom of the raw material vessel. As a result, the solid raw material in the shapes of granules/lumps in the raw material vessel is supplied into the molten raw material in the crucible.

At this time, the lower portion of the raw material vessel has been inserted in the molten raw material in the crucible or located close to the molten raw material in the crucible, though without having been inserted therein. Hence, no melt splashing essentially occurs from the molten raw material accompanying additional charge of a solid raw material, or with melt splashing on a very low scale if any. After the bottom is opened, the raw material vessel is raised, thereby enabling smooth charge of a total amount of the solid raw material into the crucible.

According to the procedure described above, static additional charge of a solid raw material can be realized without solidifying a surface of a molten raw material in a crucible.

It is desirable to raise a temperature of a raw material melt when a lower portion of a raw material vessel is immersed into the molten raw material in a crucible. In doing so, it is prevented from occurring that the surface of the molten raw material is solidified when the lower portion of the raw material vessel is immersed into the molten raw material in the crucible and the molten raw material intruding into the interior of the lower portion is solidified, to thereby break the raw material vessel. Furthermore, it is accelerated to melt and remove the bottom cover and to melt the solid raw material charged into the molten raw material. A melt temperature of a solid raw material in a crucible at an initial stage is in the range of 1420 to 1450° C. and preferably raised to a temperature higher than the range by 50 to 130° C. If the temperature rise is small, a risk arises that the molten raw material is solidified when the lower portion of the raw material vessel is immersed into the molten raw material in the crucible and the molten raw material having intruded into the interior of the lower portion is solidified to thereby break the raw material vessel, while if the temperature rise is excessively large, a risk arises that the crucible is thermally deformed and the raw material vessel is damaged.

As non-meltable materials of which a raw material vessel is made, preferable are materials with less of a risk to contaminate a molten raw material and there are preferably exemplified from this viewpoint: quartz, SiC, a carbon material coated with SiC, a metal treated with a special surface treatment, and among them, quartz is especially preferable. As meltable materials of which a bottom cover thereof is made, preferable are likewise the same materials as a solid raw material with less of a risk to contaminate a molten raw material and, in growth of a silicon single crystal, preferable is poly-silicon or a silicon single crystal. In a case where a rod is used as a support of the bottom cover, materials of the support rod are preferably the same materials as a solid raw material with less of a risk to contaminate a molten raw material and, in growth of a silicon single crystal, preferable is poly-silicon or a silicon single crystal.

It is preferable that a shape of a raw material vessel, particularly a shape of an inner surface thereof, is constant in sectional area over the entire length, and has a cylindrical surface consisting of straight lines, and especially preferable is a shape of being inversely tapered downwardly with gradual increase in sectional area. With such shapes of the inner surface assumed, dropping/discharge of a solid raw material with which a raw material vessel is filled is accelerated in the raw material vessel.

A volume of a row material vessel is preferably in the range of 10 to 20% of a volume of a crucible. If a volume of the raw material vessel is excessively small, a charge amount of a solid raw material at a time is excessively small, so a necessity arises for increasing the number of times when a raw material is charged till a total amount of a charged raw material reaches a target melt amount. Wasteful is a volume unnecessarily larger than a charge amount of a solid raw material at a time. Incidentally, if a charge amount of a solid raw material at a time is larger than necessary, a temperature of a molten raw material is excessively lowered to solidify a melt surface; therefore, it is unwise to excessively increase a charge amount of a solid raw material at a time. From this viewpoint, a charge amount of a solid raw material at a time is on the order of 20 kg.

DESCRIPTION OF THE PREFERRED EMBODIMENTS

Figure 1:
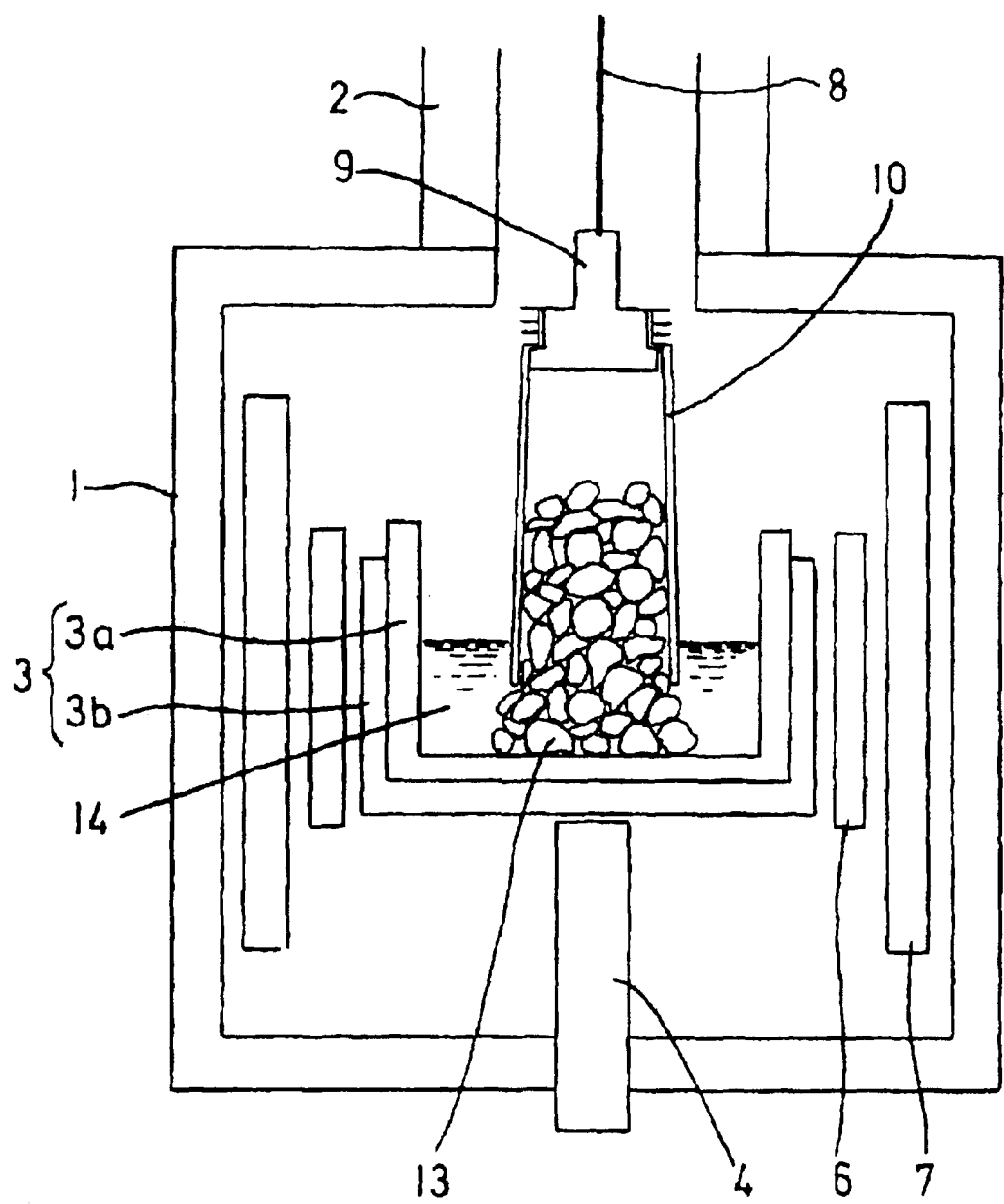
FIG. 1 is a conceptual view of a CZ raw material supply method showing an embodiment of the present invention.
Figure 2:
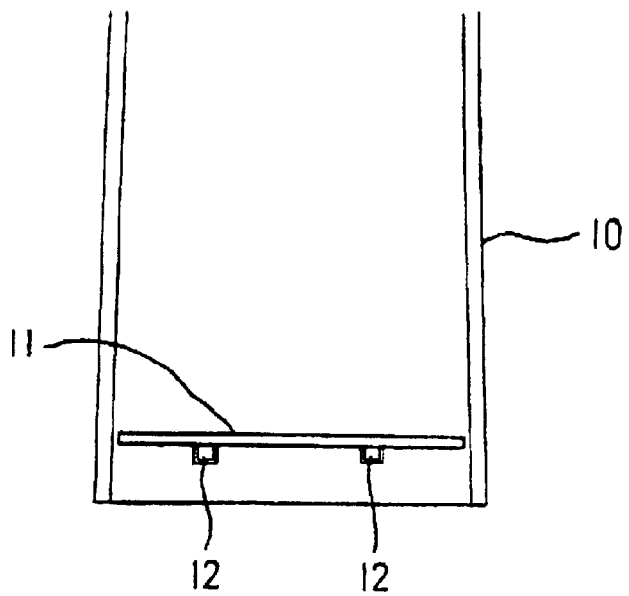
FIG. 2 is a longitudinal sectional view of a raw material vessel used in the CZ raw material supply method.
Figure 3:
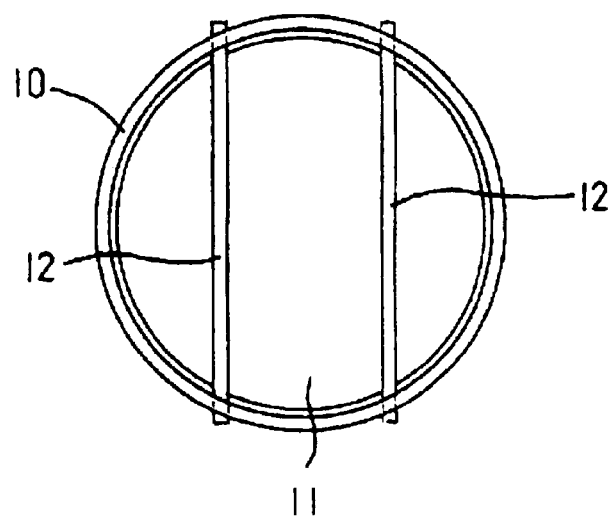
FIG. 3 is a plan view of the raw material vessel.

Detailed description will be given of an embodiment of the present invention below based on the accompanying drawings. FIG. 1 is a conceptual view of a CZ raw material supply method showing an embodiment of the present invention, FIG. 2 is a longitudinal sectional view of a main part of a CZ raw material supply tool used in the CZ raw material supply method and FIG. 3 is a bottom view of the CZ raw material supply tool.

In this embodiment, a silicon single crystal is produced by means of a CZ method. A CZ furnace used in production thereof is as shown in FIG. 1 equipped with a main chamber 1 as a furnace body and a pull chamber 2. The pull chamber 2 is smaller in diameter than the main chamber 1 and stacked on the center portion of the main chamber 1.

A crucible 3 is disposed in the center portion of the main chamber 1. The crucible 3 is of a double structure obtained by combining a quartz crucible 3a in the inner side and a graphite crucible 3b in the outer side and supported on a support shaft 4, called a pedestal, with a crucible rest interposed therebetween. The support shaft 4 drives the crucible 3 in an axial direction and a circumferential direction. A heater 6 is disposed around the outside of the crucible 3. A heat insulating material 7 is disposed around the outside of the heater 6 along the inner surface of the main chamber 1.

A wire 8 as a pull shaft is vertically extended downwardly in the pull chamber 2. The wire 8 is driven in rotation and vertical motion by a drive mechanism, not shown, provided at the topmost portion of the pull chamber 2.

In the CZ raw material supply method of this embodiment, the crucible 3 initially charged with a solid raw material of poly-silicon is at first set in a prescribed place in the main chamber 1. Subsequent to setting of the crucible 3, the raw material vessel 10 filled with a solid raw material 13 is hung down by the wire 8 above the crucible 3.

The raw material vessel 10 is a cylinder with a shape of being inversely tapered downwardly with increase in inner and outer diameters and made of quartz. The bottom face of the raw material vessel 10 is closed by a bottom cover 11. The bottom cover 11 is a disc to be fittingly engaged inside the lower portion of the raw material vessel 10 and supported in the interior of the lower portion of the raw material vessel 10 by plural support rods 12 and 12 penetrating the lowest part of the raw material vessel 10 therethrough, perpendicularly to the axial line of the raw material vessel 10. The raw material vessel 10 is filled with the solid raw material 13 made of poly-silicon in the shapes of granules/lamps on the bottom cover 11 thereof. A material of the bottom cover 11 is a silicon single crystal of a wafer-like shape cut off from an as-grown crystal and the support rods 12 and 12 are made of poly-silicon.

The raw material vessel 10 filled with such a solid raw material 13 is hung down with a hanger 9 connected to the lower end of the wire 8 and sustained above the crucible 3, and in this state, the solid raw material in the crucible 3 is molted to form a molten raw material 14 in the crucible 3. By melting the solid raw material in the crucible 3, a volume of the raw material decreases as described above.

When melting of the solid raw material in the crucible 3 is over, the raw material vessel 10 is moved down to immerse the lower portion thereof into the molten raw material 14. At this time, an output of the heater 6 is raised to increase a temperature of the raw material melt slightly higher.

When the lower portion of the raw material vessel 10 has been immersed in the molten raw material 14, the bottom cover 11 closing the bottom of the raw material vessel 10 is molten and removed by putting the bottom cover into contact with the molten raw material 14. As a result, the bottom of the raw material vessel 10 is opened and the solid raw material 13 in the shapes of granules/lumps in the raw material vessel 10 automatically falls down under a gravity thereof and is charged into the molten raw material 14.

At this time, the lower portion of the raw material vessel 10 is immersed in the molten raw material 14 below the surface thereof. Therefore, no melt splashing occurs from the raw material melt 14 in company with charge of the solid raw material 13 despite a state where the surface of the molten raw material 14 is not solidified.

Furthermore, by raising an output of the heater 6 at this time to increase a temperature of the molten raw material 14, not only is solidification of the surface accompanying immersion of the raw material vessel 10 prevented from occurring, but also breakage of the molten raw material 14 is prevented, and acceleration occurs in removal by melting of the bottom cover 11 and melting of the charged solid raw material 13. When the raw material vessel 10 is immersed into the molten raw material 14, solidification occurs in the molten raw material 14 intruding into the lower portion of the raw material vessel 10 in the immersion if a temperature of the molten raw material 14 is low, resulting in a risk to break the lower portion. If the surface of the molten raw material 14 is solidified, the raw material vessel 10 becomes hard to pull off and a portion immersed in the melt is thermally deform, thereby making repeated use thereof to be hard.

The raw material vessel 10 is raised to pull it from the molten raw material 14 to thereby charge a total amount of the solid raw material 13 in the raw material vessel 10 into the molten raw material 14. When the solid raw material 13 has been charged, the raw material vessel 10 is further moved upwardly and then taken out of the chamber.

When an amount of the molten raw material in the crucible 3 has not reached a target value, charge of a solid raw material 13 is repeated using another raw material vessel 10.

In such a way, additional charge is performed into the crucible 3 using a solid raw material 13 in the shapes of granules/lumps, low in raw material cost, and with less of a risk of cracking. As a solid raw material 13, there is mainly used lump-like raw material called lumps or granular raw material called chips, or combination thereof. Incidentally, a lump is a lump-like raw material of the order in the range of 40 to 80 mm in diameter and a chip is a granular raw material of the order in the range of 5 to 40 mm in diameter.

When an amount of the molten raw material in the crucible 3 reaches a target value after the additional charge is over, the hanger 9 connected to the lower end of the wire 8 is replaced with a seed to start a pulling operation for a single crystal.

Likewise, in a case of recharge, a solid raw material 13 in the shapes of granules/lumps is additionally charged into the molten raw material 14 in the crucible 3.

Example

Then, description will be given of a result of an example of the present invention.

A raw material was supplied according to the method described above in order to grow a silicon single crystal of 8 inch in diameter using a crucible of 22 inch in diameter. To be concrete, 100 kg of lumps was initially charged into the crucible. Furthermore, a raw material vessel made of quartz was used and 20 kg of lumps was hung above the crucible. The raw material vessel was a tapered tube of about 200 mm in average diameter, of about 500 mm in length, and a diameter of which increases downwardly. A filling percentage of lumps was in the range of 50 to 55%.

Lumps initially charged in the crucible were molten. The raw material vessel was held at a position where a temperature is equal to or lower than 1100° C. during a period of the initial melting in order to prevent thermal deformation of the raw material vessel. An initial melt temperature of the solid raw material in the crucible was controlled in the range of 1420 to 1450° C.

When all of the raw material initially charged in the crucible was molten, a melt temperature was raised by about 100° C. Then, as a first step of a charge operation, the raw material vessel is moved down to a position where the support rods supporting the bottom cover were immersed in the molten raw material. After it was confirmed that the support rods were quickly adapted for the molten raw material in the surroundings and started to melt, the raw material vessel was moved down as a second step, by about 30 mm. Since, while monitoring over time, it was observed that the lumps in the raw material vessel fell down, the process immediately went to a third step, where the raw material vessel was raised a little to pull it off from the molten raw material. By doing so, all of the lumps in the raw material vessel was dropped into the molten raw material without any of lumps remaining therein. Since the dropped lumps floated on the surface of the molten raw material directly below the raw material vessel and started to solidify the molten raw material therearound, the raw material vessel was further raised from a position where the raw material vessel was not in contact with the solidified mass and taken out of the chamber.

In such a way, the lumps additionally charged into the crucible were completely molten under the same conditions as in initial melting.

Other Examples

Figure 4:
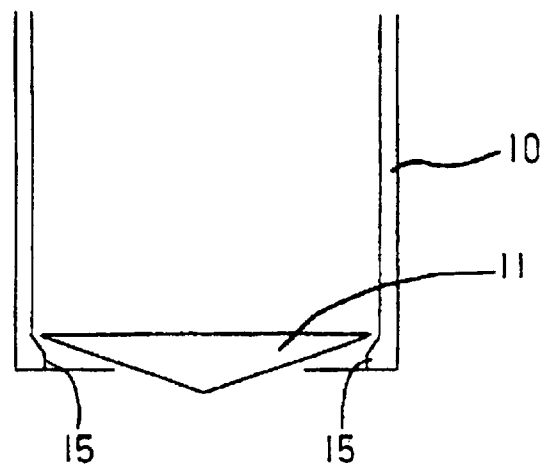
FIG. 4 is a longitudinal sectional view of a second raw material vessel.
Figure 5:
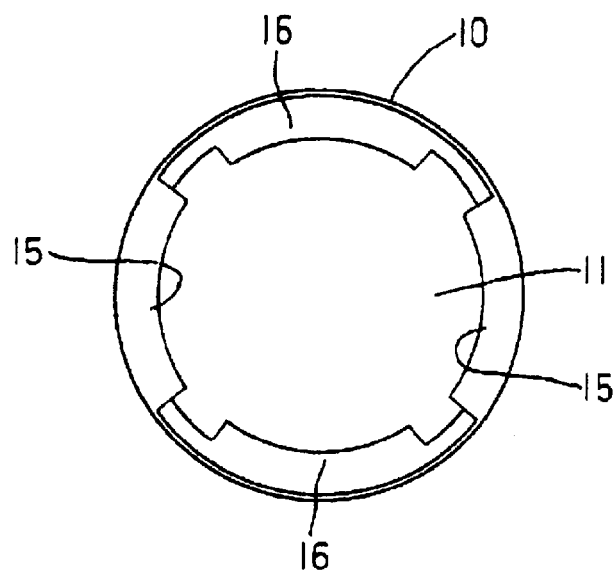
FIG. 5 is a plan view of the second raw material vessel.

FIG. 4 is a longitudinal sectional view of a main part of a second CZ raw material supply tool and FIG. 5 is a bottom view of the second CZ raw material supply tool.

The CZ raw material supply tool shown in FIGS. 4 and 5, similar to the CZ raw material supply tool shown previously, includes: a non-meltable raw material vessel 10 in the shape of a cylinder; and a meltable bottom cover 11 closing the bottom of the raw material vessel 10. The CZ raw material supply tool shown in FIGS. 4 and 5 is different from the CZ raw material supply tool shown previously in the shape of the bottom cover 11 and a fixing structure thereof.

That is, the bottom cover 11 herein is a silicon single crystal in the shape of an inverse circular cone. The bottom cover 11 in the shape of an inverse circular cone is a top portion (a shoulder portion) or a tail portion, both in the shape of a circular cone, and not processed in to wafers of a silicon single crystal that was pulled in the past with a definite production history. Since the top portion (the shoulder portion) or the tail portion is a waste not to be processed into products, it is used as the bottom cover 11 to thereby raise a utilization efficiency of the silicon single crystal.

In order to retain the bottom cover 11 within the interior of the lower portion of the raw material vessel 10, anchoring portions 15 and 15 are provided symmetrically with respect to the center at plural positions in a circumferential direction on the lower end of the raw material vessel 10, protruding inwardly at a right angle to the inner surface. On the other hand, cut-away portions 16 and 16 through which anchoring portions 15 and 15 can pass are provided symmetrically with respect to the center along the outer peripheral portion of the bottom cover 11.

By causing the anchoring portions 15 and 15 to pass through the cut-away portions 16 and 16, the bottom cover 11 is inserted into the interior of the raw material vessel 10. After the insertion, the bottom cover 11 is turned in a circumferential direction to thereby anchor the bottom cover 11 with the anchoring portions 15 and 15.

In such a way, the bottom cover 11 held in the interior of the raw material vessel 10 also holds a solid raw material 13 in the raw material vessel 10, in a similar way to the bottom cover described previously, and is molten and removed by putting the raw material vessel 10 into contact with the molten raw material 14 accompanying immersion of the raw material vessel 10 into the molten raw material 14 to open the bottom thereof. By doing so, raw material charge can be realized without causing melt splashing.

Figure 6:
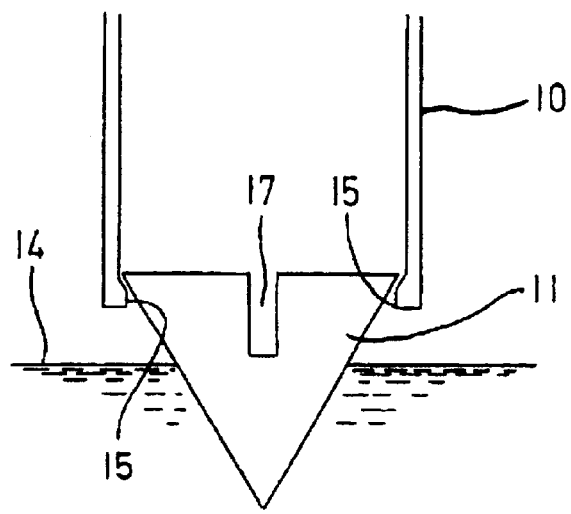
FIG. 6 is a longitudinal sectional view of a third raw material vessel.
Figure 7:
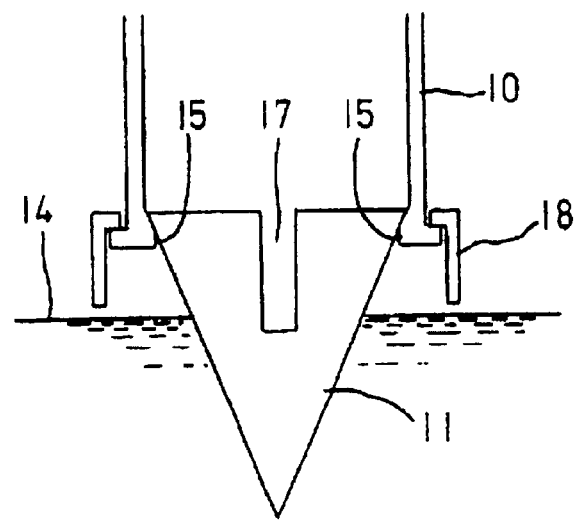
FIG. 7 is a longitudinal sectional view of a fourth raw material vessel.

FIGS. 6 and 7 are longitudinal sectional views of main parts of third and fourth CZ raw material supply tools.

Each of CZ raw material supply tools shown in FIGS. 6 and 7, similar to the CZ raw material supply tool described previously, includes: a non-meltable raw material vessel 10 in the shape of a cylinder; and a meltable bottom cover 11 closing the bottom of the raw material vessel 10. The CZ raw material supply tools shown in FIGS. 6 and 7 are different from the CZ raw material supply tool described previously in that the raw material vessels 10 are of an non-immersion type. That is, the CZ raw material supply tools shown in FIGS. 6 and 7 are different from the CZ raw material supply tool described previously in that melting and removal of the bottom covers 11 are implemented by not immersing the raw material vessels 10 into the molten raw material 14.

To be described in detail, the bottom cover 11 is a top portion (a shoulder portion) or a tail portion in the shape of a circular cone not processed into wafers of a silicon single crystal that was pulled in the past with a definite production history and held by anchoring portions 15 and 15 provided, as described previously, on the lower end of the raw material vessel 10 in a posture of an inverse circular cone in which the vertex thereof is directed downwardly and a portion excluding the base portion thereof is protruded below the raw material vessel 10. A groove 17 is formed in the base end face, which is the top face of the bottom cover 11, in a direction of depth at a right angle to the base end face, extending in a direction of diameter, and reaching as far as the protruded portion.

By using such a bottom cover 11, the bottom cover 11 can be molten and removed without immersing the lower portion of the raw material vessel 10 into the molten raw material 14. That is, the raw material vessel 10 accommodating the solid raw material 13 is moved close to the molten raw material 14 to immerse the lower portion of the bottom cover 11 into the molten raw material 14 and to cause the bottom cover 11 to be molted as far as the groove 17. Then, the bottom cover 11 is broken at the groove 17 and falls into the molten raw material 14 to thereby remove it from inside of the lower portion of the raw material vessel 10 and to open the bottom of the raw material vessel 10.

Since when in charge of a solid raw material, the lower portion of the raw material vessel 10 is not immersed into the molten raw material 14, the raw material vessel 10 is prevented from being damaged to thereby extend a lifetime in usage thereof. As for melt splashing when in charge of raw material, since the lower portion of the raw material vessel 10 is not immersed into the molten raw material 14, melt splashing is more conspicuous as compared with a case of immersion. Since the raw material vessel 10 is located at a position close to the molten raw material 14, the melt splashing is not serious. If the melt splashing is problematic, a cover 18 in the shape of a cylinder covering a gap between the raw material vessel 10 and the molten raw material 14 is attached to the lower end of the raw material vessel 10, thereby enabling the problem of melt splashing to be substantially solved.

As described above, a CZ raw material supply method of the present invention can melt and remove a bottom cover by putting it into contact with a molten raw material in a construction in which the bottom of a raw material vessel in the shape of a cylinder made of a non-meltable material is closed with the bottom cover made of a meltable material, the interior of the raw material vessel is filled with a solid raw material in the shapes of granules/lumps and in this state, the lower portion of the raw material vessel is immersed into or moved close to the molten raw material in the crucible. By doing so, supply of the solid raw material in the shapes of granules/lumps can be realized without solidifying the surface of the molten raw material in the crucible and in addition, substantially without causing melt splashing. As a result, a problem of melt splashing is solved and in addition, increase can be avoided in heating cost accompanying melting a solidified layer.

What is claimed is:

1. A CZ raw material supply method for charging a solid raw material in the shapes of granules/lumps into a molten raw material in a crucible in single crystal growth by means of a CZ method, comprising: a step of closing a bottom of a cylindrical raw material vessel made of a material non-meltable when being in contact with said molten material in said crucible with a bottom cover made of a material meltable and removable when being in contact with said molten raw material in said crucible to cause said raw material vessel to be filled with said solid raw material in the shapes of granules/lumps; a step of hanging down said raw material vessel, attached with said bottom cover, and filled with said solid raw material above said crucible to melt said bottom cover by putting it into contact with said molten raw material in said crucible and to thereby open a bottom of said raw material vessel; and a step of supplying said solid raw material in said raw material vessel into said molten raw material in said crucible from said opened bottom.

2. The CZ raw material supply method according to claim 1, wherein a lower portion of said raw material vessel is immersed into said molten raw material in said crucible to thereby put said bottom cover into contact with said molten raw material in said crucible and remove said bottom cover.

3. The CZ raw material supply method according to claim 1, wherein said lower portion of said raw material vessel is moved close to said molten raw material in said crucible to thereby put said bottom cover into contact with said molten raw material in said crucible and remove said bottom cover.

4. The CZ raw material supply method according to claim 2, wherein a temperature of said molten raw material is higher than a melt temperature of said solid raw material in said crucible at an initial stage in the range of 1420 to 1450° C. by 50 to 130° C. when said lower portion of said raw material vessel is immersed into said molten raw material in said crucible.

5. The CZ raw material supply method according to claim 1, wherein a volume of said raw material vessel is in the range of 10 to 20% of a volume of said crucible.

6. The CZ raw material supply method according to claim 1, wherein said non-meltable material of which said raw material vessel is made is quartz or SiC.

7. The CZ raw material supply method according to claim 1, wherein said meltable material of which said bottom cover is made is the same material as said solid raw material.

* * * * *